United States Patent
Kang et al.

(10) Patent No.: US 7,663,903 B2
(45) Date of Patent: Feb. 16, 2010

(54) SEMICONDUCTOR MEMORY DEVICE HAVING IMPROVED VOLTAGE TRANSMISSION PATH AND DRIVING METHOD THEREOF

(75) Inventors: Sun-Won Kang, Seoul (KR); Seung-Duk Baek, Gyeonggi-do (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 63 days.

(21) Appl. No.: 11/864,604

(22) Filed: Sep. 28, 2007

(65) Prior Publication Data
US 2008/0123386 A1    May 29, 2008

(30) Foreign Application Priority Data
Nov. 24, 2006   (KR)   ...................... 10-2006-0117087

(51) Int. Cl.
G11C 5/06      (2006.01)
G11C 5/00      (2006.01)
H01L 23/02     (2006.01)
H01L 23/48     (2006.01)

(52) U.S. Cl. ........................... 365/63; 365/52; 257/666; 257/777

(58) Field of Classification Search ..................... 365/63
See application file for complete search history.

(56) References Cited

U.S. PATENT DOCUMENTS

| | | | | |
|---|---|---|---|---|
| 6,762,078 B2* | 7/2004 | Shin et al. | .................... | 438/123 |
| 6,798,049 B1* | 9/2004 | Shin et al. | .................... | 257/678 |
| 7,247,935 B2* | 7/2007 | Kawano | ..................... | 257/686 |
| 7,342,309 B2* | 3/2008 | Yoshida | ....................... | 257/723 |
| 2005/0104209 A1* | 5/2005 | Kang | ............................ | 257/737 |
| 2006/0134833 A1* | 6/2006 | Baek et al. | .................... | 438/108 |
| 2007/0109831 A1* | 5/2007 | RaghuRam | ................... | 365/63 |
| 2007/0281374 A1* | 12/2007 | Lee et al. | ....................... | 438/14 |
| 2008/0001276 A1* | 1/2008 | Lee et al. | ..................... | 257/686 |
| 2008/0128882 A1* | 6/2008 | Baek et al. | .................. | 257/686 |

(Continued)

FOREIGN PATENT DOCUMENTS

JP    2000-012618    1/2000

(Continued)

OTHER PUBLICATIONS

English language abstract of Japanese Publication No. 2000-012618.

(Continued)

*Primary Examiner*—Son L Mai
(74) *Attorney, Agent, or Firm*—Muir Patent Consulting, PLLC

(57) ABSTRACT

Provided are a semiconductor memory device and a method of driving the device which can improve a noise characteristic of a voltage signal supplied to a memory cell of the device. The semiconductor memory device includes a first semiconductor chip and one or more second semiconductor chips stacked on the first chip. The first chip includes an input/output circuit for sending/receiving a voltage signal, a data signal, and a control signal to/from an outside system. The one or more second semiconductor chips each include a memory cell region for storing data. The second semiconductor chips receive at least one signal through one or more signal paths that are formed outside the input/output circuit of the first chip.

18 Claims, 7 Drawing Sheets

U.S. PATENT DOCUMENTS

2008/0258259 A1* 10/2008 Osaka et al. ................ 257/532

FOREIGN PATENT DOCUMENTS

| KR | 2003-0074205 | 9/2003 |
|---|---|---|
| KR | 2003-0083306 | 10/2003 |

OTHER PUBLICATIONS

English language abstract of Korean Publication No. 2003-0074205.
English language abstract of Korean Publication No. 2003-0083306.

* cited by examiner

//////////////////////////////////////////////////////////////
SEMICONDUCTOR MEMORY DEVICE HAVING IMPROVED VOLTAGE TRANSMISSION PATH AND DRIVING METHOD THEREOF

CROSS-REFERENCE TO RELATED PATENT APPLICATION

This application claims the benefit of Korean Patent Application No. 10-2006-0117087, filed on Nov. 24, 2006, in the Korean Intellectual Property Office, the disclosure of which is incorporated herein by reference.

BACKGROUND

1. Field of the Invention

The present invention relates to a semiconductor memory device and a driving method thereof, and more particularly, to a semiconductor memory device and a driving method thereof that are capable of improving a noise characteristic of a voltage signal provided to a memory cell of the semiconductor memory device.

2. Description of the Related Art

In recent years, the capacity and speed of memory chips, which are used as memory devices in electronic systems, have increased. Furthermore, various attempts to increase memory capacity per unit area and to drive the memory more rapidly have been made.

FIG. 1 is a schematic view of a general conventional semiconductor chip 10. Referring to FIG. 1, the semiconductor chip 10 includes an I/O region 11, which includes an input/output circuit for sending/receiving data signals and control signals, etc. to/from an outside system, and cell regions 12, which include memory cells for storing the data.

Generally, the semiconductor chip 10 has a structure in which the I/O region 11 is disposed in a central region of the semiconductor chip 10 and the cell regions 12 are disposed on both sides of the I/O region 11. The I/O region 11 includes one or more pads PAD, where voltage signals, data signals, and control signals, etc. are inputted from the outside system via the pads PAD. In order to store or read the data, the voltage signals, the data signals, and the control signals are supplied to the cell regions 12 through the input/output circuit of the I/O region 11.

In the semiconductor chip 10, the area of the cell regions 12 occupies most of the chip area, and paths of the power supply voltage and the ground voltage supplied to the memory cells pass through the I/O region 11 in the center of the semiconductor chip 10. In a general case, the power supply voltage and the ground voltage are applied to a semiconductor package on which the semiconductor chip 10 is mounted through solder balls disposed on an outer surface of the semiconductor package. However, in this configuration, a feed/sink path of the voltage signals becomes relatively long, which hampers performance characteristics of the chip 10.

FIG. 2 is a cross-sectional view of a general conventional semiconductor package that illustrates a path of a voltage signal transferred to the semiconductor chip. Referring to FIG. 2, the semiconductor package may include one or more semiconductor chips having a stacked structure, and a package substrate 30 for mounting the stacked semiconductor chips.

FIG. 2 illustrates a case where two semiconductor chips are stacked as an example of a conventional semiconductor package. In addition, the semiconductor package illustrates an example in which one or more semiconductor chips are packaged in a wafer stack form. The two semiconductor chips include I/O regions 11 and 21, respectively, which are positioned in the center of the package substrate 30, and cell regions 12 and 22 which are disposed on both sides of the I/O regions 11 and 21, respectively.

A power supply voltage or a ground voltage that is transferred from one or more solder balls mounted on the bottom surface of the package substrate 30 through the I/O regions 11 and 21 to reach the cell regions 12 and 22. The power supply voltage or the ground voltage is inputted to an input/output circuit included in the I/O regions 11 and 21 and is then supplied from the input/output circuit to the cell regions 12 and 22. An arrow indicated in FIG. 2 shows a path through which the voltage signal from the solder balls attached to the outer surface of the package substrate 30 is supplied to the cell region 12.

In order to supply the voltage signal from the I/O regions 11 and 21 to the cell regions 12 and 22, aluminum wiring, which has a relatively large resistance, is generally used. As FIG. 2 shows, this path can become relatively long. This length coupled with the large resistance of the wiring path can generate noise in the voltage signal provided to the cell regions 12 and 22. As a result, the performance of the entire memory system deteriorates.

SUMMARY

Embodiments of the present invention provide a semiconductor memory device and a driving method thereof which are capable of providing a stable voltage signal to a memory cell of the semiconductor memory device.

According to an embodiment of the present invention, a semiconductor memory device includes a first semiconductor chip and one or more second semiconductor chips stacked on the first chip. The first semiconductor chip includes an input/output circuit for sending/receiving a voltage signal, a data signal, and a control signal to/from an outside system. The one or more second semiconductor chips each include a memory cell region for storing data. The second semiconductor chips receive at least one signal through one or more signal paths that are formed outside the input/output circuit of the first semiconductor chip.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
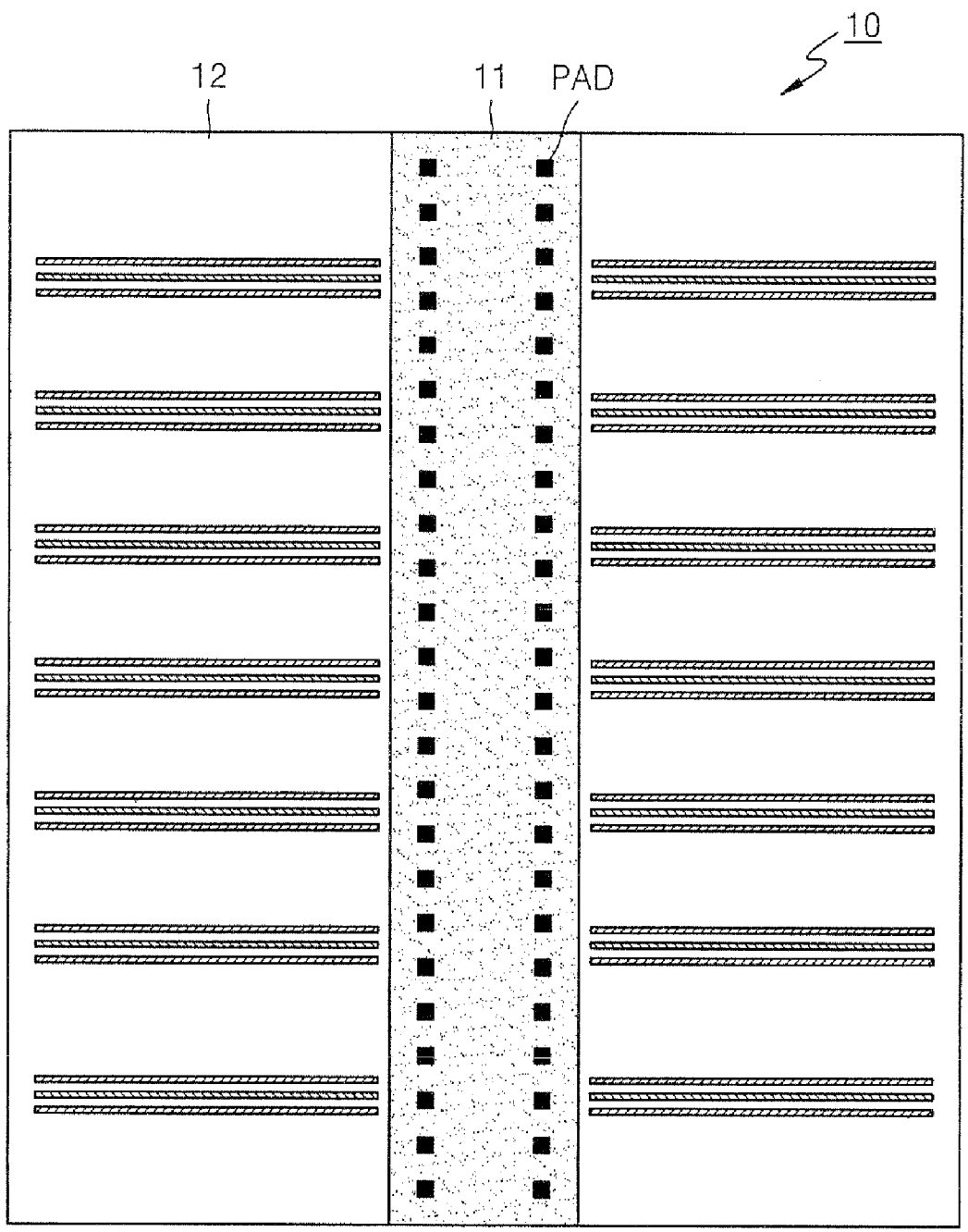
FIG. 1 is a schematic view of a general conventional semiconductor chip structure.
Figure 2:
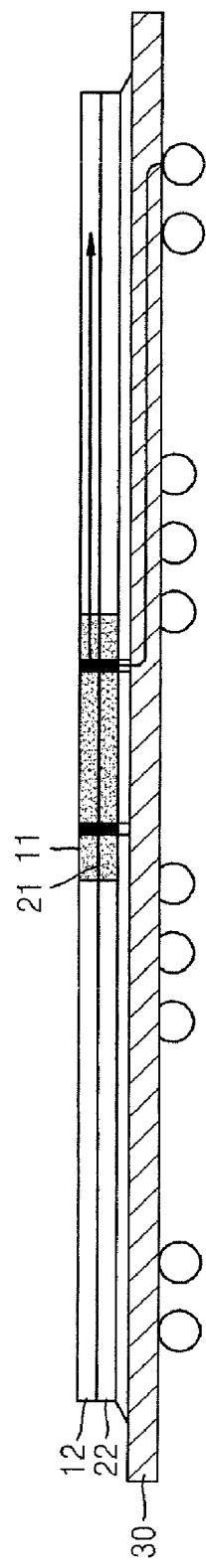
FIG. 2 is a cross-sectional view of a general conventional semiconductor package that illustrates a path through which a voltage signal is transferred to a semiconductor chip.

The present invention will now be described more fully hereinafter with reference to the accompanying drawings, in which exemplary embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 3:
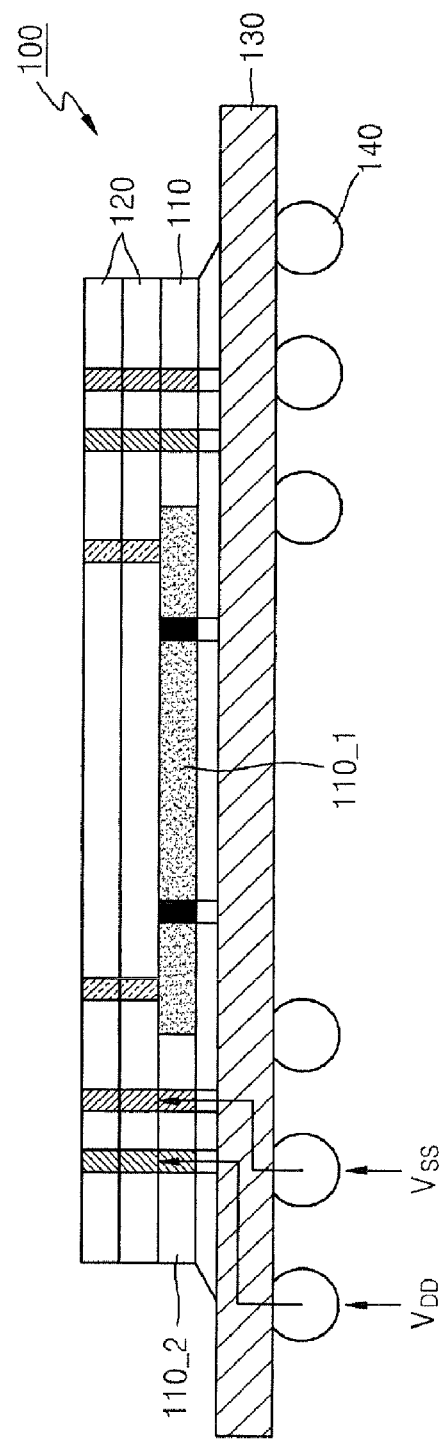
FIG. 3 is a cross-sectional view of a semiconductor memory device according to an embodiment of the present invention.

FIG. 3 is a cross-sectional view of a semiconductor memory device 100 according to an embodiment of the present invention. The semiconductor memory device 100 shown in a packaged form may include a first semiconductor chip 110 that includes an input/output circuit for sending/receiving a voltage signal, a data signal and a control signal, etc. to/from the outside system. The semiconductor memory device 100 may also include one or more second semiconductor chips 120, each of which includes a memory cell region for storing data. Although two semiconductor chips are illustrated in FIG. 3, one, two, or more second semiconductor chips 120 may be stacked on the first semiconductor chip 110.

In other words, although the input/output circuit and memory cells are included in one chip in the prior art, the embodiment of the present invention illustrated in FIG. 3 includes at least two separate semiconductor chips, where a first semiconductor chip 110 includes an input/output circuit and one or more second semiconductor chips include memory cells.

Referring again to FIG. 3, the semiconductor memory device 100 may include a package substrate 130 for stacking the first semiconductor chip 110 and the second semiconductor chip 120 on a first side (e.g., the upper surface) and one or more solder balls 140 attached to a second side (e.g., the bottom surface) of the package substrate 130 for electrically connecting the first and second semiconductor chips to an outside system. A circuit pattern (or wiring) is formed in the package substrate 130 to transfer the signals inputted through the solder balls (or connection terminals) 140 to the first and second semiconductor chips. In addition, the solder balls 140 may include one or more solder balls dedicated to supplying a power supply voltage VDD and one or more solder balls dedicated to supplying a ground voltage VSS to the semiconductor memory device 100.

The first semiconductor chip 10 includes an active region 110_1 in which the input/output circuit is actually disposed. Since the area of the input/output circuit is smaller than that of the memory cell region of the second semiconductor chip 120, the active region 110_1 is implemented so as to be smaller than the second semiconductor chip 120.

In order to smoothly transfer the signals between the first semiconductor chip 110 and the second semiconductor chip 120, the first semiconductor chip 110 may include an overhead region 110_2 in which at least one conductive means is formed. The overhead region 110_2 may be disposed on both sides of the active region 110_1, and the first semiconductor chip 110 including the active region 110_1 and the overhead region 110_2 may be manufactured so as to be substantially equal in size to the second semiconductor chips 120.

The voltage signal, the data signal and the control signal are inputted to the first and second semiconductor chips 110 and 120 via a package substrate 130 and a solder ball 140. The inputted data signal and control signal are supplied to the second semiconductor chip 120 so that read and write operations on the memory cell are performed. On the other hand, the inputted voltage signal is used as a power supply for driving the first and second semiconductor chips 110 and 120.

As shown in FIG. 3, at least one of these signals can be inputted to the second semiconductor chip 120 through a separate electrical path formed outside the active region 110_1 of the first semiconductor chip 110. It may be especially beneficial to input the power supply Vdd and/or the ground voltage Vss though the separate electrical path or separate electrical paths because these voltage signals can be directly routed to the memory cells without passing through the input/output circuit in the active region 110_1 of the first semiconductor chip 110.

To this end, at least one conductive means is formed in the overhead region 110/_2 of the first semiconductor chip 110. This at least one conductive means may be implemented as one or more vias. A conventional wafer through-via forming process may be used to form the vias. Some of the vias formed in the overhead region 110_2 may be electrically connected to the solder ball for supplying the power supply voltage VDD, and other vias may be electrically connected the solder ball for supplying the ground voltage VSS.

Additionally, the second semiconductor chip 120 may include at least one conductive means to which the voltage signal inputted through the via is transferred into the second semiconductor chip 120. The one or more vias may also pass through a second semiconductor chip 120 to reach another second semiconductor chip 120 above it. A first via may be formed in the second semiconductor chip 120 and connected to the via which is formed in the overhead region 110_2 to transfer the power supply voltage VDD. In addition, a second via may be connected to the via which is formed in the overhead region 110_2 to transfer the ground voltage VSS.

On the other hand, a third via for receiving the data signal and the control signal etc. may be further formed in the second semiconductor chip 120. When the first semiconductor chip 110 and the second semiconductor chip 120 are stacked, the third via may be formed in a region corresponding to the active region 110_1 of the first semiconductor chip 110. The third via may be electrically connected to the input/output circuit, and the data and the control signal may be supplied to the memory cell included in the second semiconductor chip 120 through the third via.

In addition, when forming the first via and the second via in the second semiconductor chip 120, the vias may be formed at positions corresponding to the vias formed in the overhead region 110_2 of the first semiconductor chip 110. As an example, when the first semiconductor chip 110 and the second semiconductor chip 120 are stacked, the first via may be formed at a position which corresponds to a fourth via within the overhead region 110_2 to be electrically connected to the power supply voltage VDD. The second via may also be formed at a position which corresponds to a fifth via within the overhead region 110_2 to be electrically connected to the ground voltage VSS.

According to an embodiment of the present invention, the input/output circuit and the memory cells are implemented as separate chips. Additionally, the power supply voltage and the ground voltage which are supplied to the memory cell may be transferred through separate paths which are formed outside the input/output circuit. Accordingly, a feed path of the power supply voltage and a sink path of the ground voltage of the power supply voltage can be reduced, so that voltage noise which is generated in the input/output circuit and the memory cells do not affect each other.

In addition, since the input/output circuit and the memory cells are implemented as separate chips, memory devices which operate in different operating modes, such as DDR1, DDR2, and GDDR etc. in accordance with the characteristic of the semiconductor chip which includes the input/output circuit, may be implemented. FIG. 3 illustrates an example in which a plurality of chips are mounted in the substrate in a flip chip configuration. However, the present invention is not limited to this configuration. Alternatively, the plurality of chips may be connected to each other through wire bonding, or each chip may be formed as an independent package by attaching solder balls to the chip.

Figure 4:
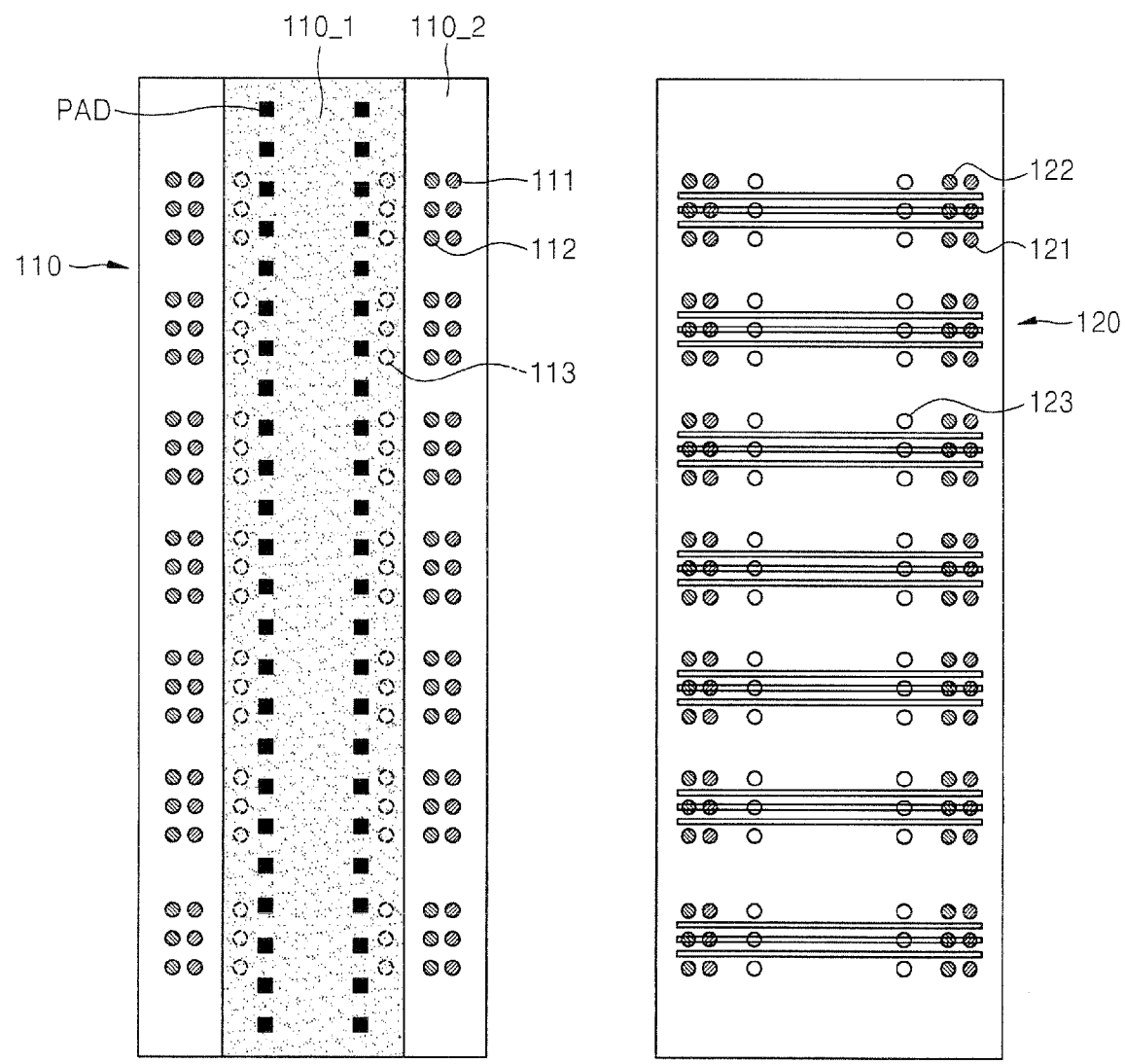
FIG. 4 illustrates a via structure which is formed in the semiconductor memory device illustrated in FIG. 3, according to an embodiment of the present invention.

FIG. 4 illustrates a via structure which is formed in the semiconductor memory device 100 illustrated in FIG. 3, according to an embodiment of the present invention. The first semiconductor chip 110 and the second semiconductor chip 120 are illustrated in FIG. 4.

Referring to FIG. 4, the first semiconductor chip 110 may include the active region 110_1 and the overhead region 110_2. A predetermined input/output circuit (not shown), one or more pads PAD, and one or more conductive means 113 may be included in the active region 110_1. In addition, one or more conductive means 111 and 112 may be included in the overhead region 110_2. A wafer through via is shown as an example of the conductive means 111 through 113.

A pattern (not shown) for transferring the voltage to the memory cell is formed in the second semiconductor chip 120, and the second semiconductor chip 120 includes one or more conductive means, such as first vias 121 through third vias 123, for receiving the voltage signal, the data signal, and the control signal, etc. When the first semiconductor chip 110 and the second semiconductor chip 120 are stacked, the first vias 121 and the second vias 122 are positioned above the overhead region 110_2 of the first semiconductor chip 110, and the third vias 123 are positioned above the active region 110_1 of the first semiconductor chip 110.

The first vias 121 of the second semiconductor chip 120 are electrically connected to fourth vias 111 of the first semiconductor chip 110. In addition, the fourth vias 111 are electrically connected to a power supply voltage VDD through the solder ball and a substrate (130 in FIG. 3) of a semiconductor package. Accordingly, the power supply voltage VDD may be inputted to the first vias 121 through the fourth vias 111 to supply the power supply voltage VDD to the memory cell.

Additionally, the second vias 122 of the second semiconductor chip 120 are electrically connected to a fifth via 112 of the first semiconductor chip 110. In addition, the fifth via 112 is electrically connected the ground voltage VSS through the solder ball and the substrate (130 in FIG. 3) of the semiconductor package. Accordingly, the ground voltage VSS may be inputted to the second vias 122 through the fifth vias 112 to supply the ground voltage VSS to the memory cell.

The third vias 123 of the second semiconductor chip 120 are electrically connected to the input/output circuit through vias 113 which are formed in the active region 110_1 of the first semiconductor chip 110. Accordingly, the data signal and the control signal may be inputted from the input/output circuit and to perform a read/write operation on the memory cell.

Figure 5:
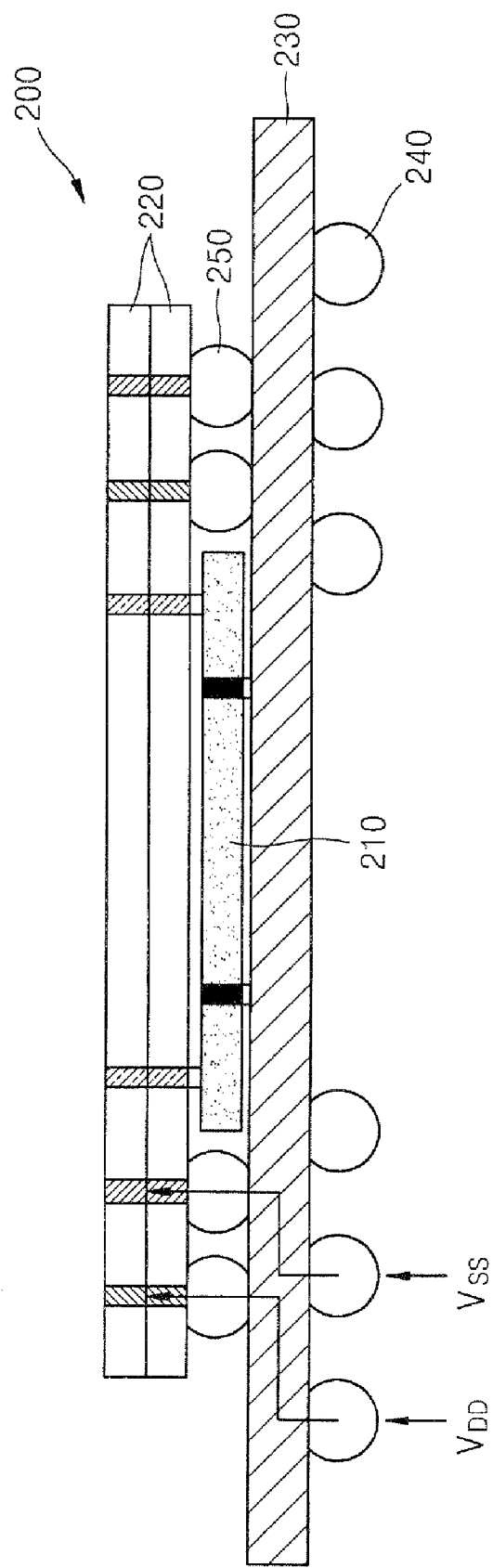
FIG. 5 is a cross-sectional view of a semiconductor memory device according to another embodiment of the present invention.

FIG. 5 is a cross-sectional view illustrating a semiconductor memory device 200 according to another embodiment of the present invention. Referring to FIG. 5, the semiconductor memory device 200 may include a first semiconductor chip 210 that includes an input/output circuit for sending/receiving a voltage signal, a data signal, and a control signal to/from the device, and one or more second semiconductor chips 220, each of which includes a memory cell region for storing data. In addition, the semiconductor memory device 200 may include a package substrate 230 for stacking the first semiconductor chip 210 and the second semiconductor chip 220 on a first side (e.g., the upper surface), and one or more first solder balls 240 attached to a second side (e.g., the bottom surface) of the package substrate 230 for electrically connecting the semiconductor chips to an outside system. The semiconductor memory device 200 operates in a similar way to the semiconductor memory device 100 illustrated in FIG. 3, and thus a detailed description thereof will be omitted.

FIG. 5 illustrates an example in which the chips in the package are implemented as a wafer stack, and in the present embodiment, the first semiconductor chip 210 comprises only an active region. One or more vias are formed in the first semiconductor chip 210, and the data signal, the control signal, and the voltage signal, etc. for the first semiconductor chip 210 can be transferred through the vias.

On the other hand, the voltage signals, such as the power supply voltage VDD and the ground voltage VSS etc. which are supplied to the memory cell may be supplied to the second semiconductor chip 220 through separate paths which do not pass through the first semiconductor chip 210. As an example, the second semiconductor chip 220 may include at least one conductive means which is composed of vias etc. passing through the first semiconductor chip 210, and at least one conductive means disposed outside the edge boundaries of the first chip 210 on the package substrate 230. Specifically, the semiconductor memory device 200 further includes a conductive means which is positioned at the outside of the first semiconductor chip 210. This conductive means may be implemented as one or more second solder balls 250. The vias which are formed in the second semiconductor chip 220 and the package substrate 230 may be electrically connected to each other through a plurality of the second solder balls 250.

Some of the plurality of second solder balls 250 may be connected to the power supply voltage Vdd through the first solder balls 240 connected to the outside system and the package substrate 230. In addition, other solder balls of the second solder balls 250 may be electrically connected to some of the vias formed in the second semiconductor chip 220 so that the power supply voltage VDD can be supplied to the memory cell. In addition, separate solder balls of the second solder balls 250 may be connected to the ground voltage Vss through the first solder balls 240 connected to the outside system and the package substrate 230. Furthermore, other solder balls may be connected to other vias formed in the second semiconductor chip 220 so that the ground voltage Vss can be supplied to the memory cell.

When constructed as described above, the first semiconductor chip 210 does not include the overhead region, so that the size of the first semiconductor chip can be decreased. As a result, there is an advantage in that the semiconductor chips that include more the input/output circuits in the same wafer can be obtained by with a decrease in the size of the first semiconductor chip 210.

Figure 6:
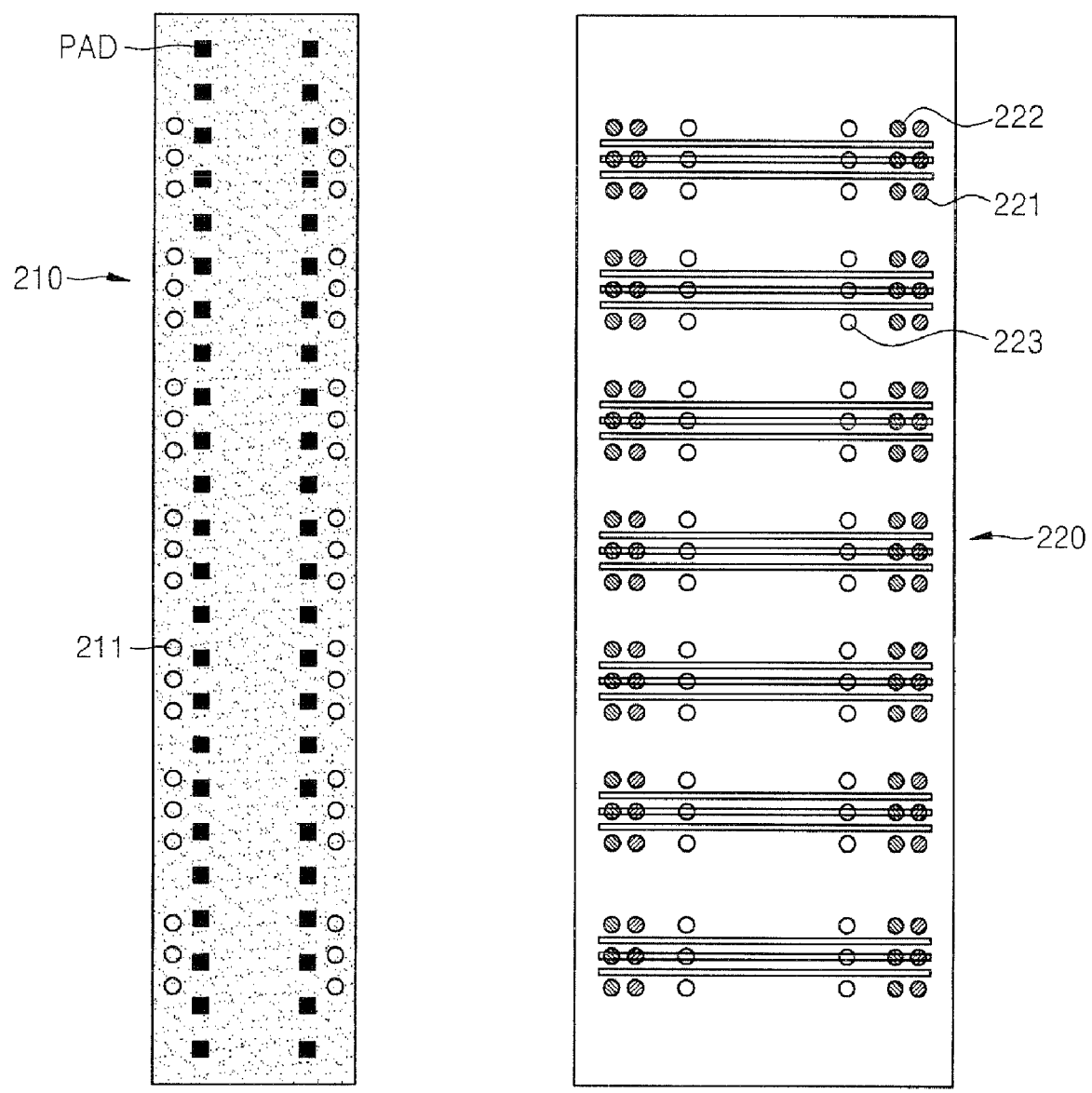
FIG. 6 illustrates a via structure which is formed in the semiconductor memory device illustrated in FIG. 5, according to an embodiment of the present invention.

FIG. 6 shows a via structure which is formed in the semiconductor memory device 200 illustrated in FIG. 5, according to an embodiment of the present invention. As shown in FIG. 5, the first semiconductor chip 210 includes only the active region in which the input/output circuit (not shown) is disposed. The first semiconductor chip 210 may include one or more pads PADs and one or more conductive means 211. The conductive means 211 may comprise one or more vias, and the data signal, the control signal, and the voltage signal for the first semiconductor chip 210 etc. may be transferred through the vias.

Additionally, a pattern for transferring the voltage to the memory cells is formed in the second semiconductor chip 220, where the second semiconductor chip 220 includes one or more conductive means, such as first vias 221 through third vias 223 for receiving the voltage signal, the data signal, and the control signal, etc. One or more first vias 221 and one or more second vias 222 may be connected to the solder balls 250 as illustrated in FIG. 5 to thereby supply the power supply voltage VDD and the ground voltage VSS into the second semiconductor chip 220, respectively. On the other hand, one or more third vias 223 may be connected to the input/output circuit of the first semiconductor chip 210 to thereby supply the data signal and the control signal into the second semiconductor chip 220.

Figure 7:
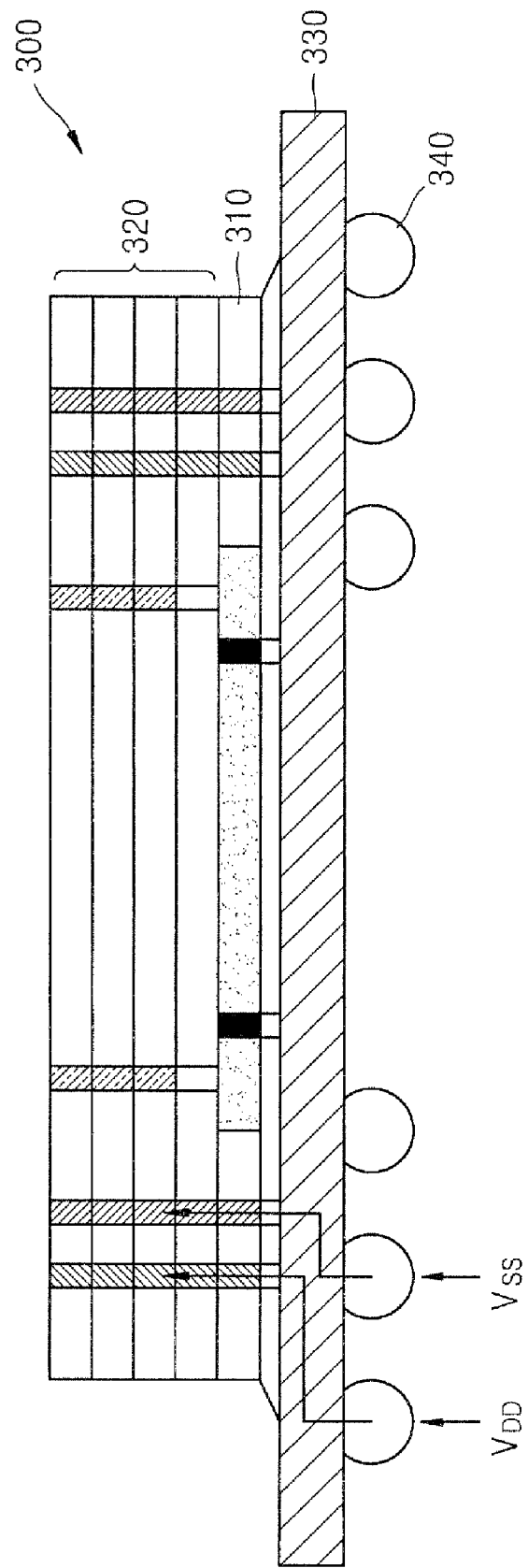
FIG. 7 is a cross-sectional view of a high-capacity semiconductor memory device according to an embodiment of the present invention.

FIG. 7 is a cross-sectional view illustrating a high-capacity semiconductor memory device 300 according to an embodiment of the present invention. Referring to FIG. 7, a plurality of semiconductor chips are mounted in a stacked structure in the semiconductor memory device 300 according to the current embodiment of the present invention. In the semiconductor memory device 300 illustrated in FIG. 7, four semiconductor chips are mounted in a wafer stack structure. However, the present invention is not limited thereto, and it is obvious that more semiconductor chips can be mounted in the package.

The semiconductor memory device 300 may include a first semiconductor chip 310 including an input/output circuit, and one or more second semiconductor chips 320 each of which includes a memory cell region. The semiconductor memory device 300 may also include a package substrate 330 for stacking the first semiconductor chip and the second semiconductor chips, and one or more solder balls 340 for electrically connecting the first semiconductor chip and the second semiconductor chips to an outside system. As shown in FIG. 7, the first semiconductor chip 310 may include both an active region and an overhead region; however, as described above, the first semiconductor chip 310 may include only the active region. In this case, an additional connection means is required for electrically connecting the second semiconductor chips 320 to the package substrate 330.

Additionally, at least one via is formed in each of the plurality of second semiconductor chips 320. When the plurality of second semiconductor chips 320 are stacked, the via may be formed in the same position in each of the semiconductor chips so as to be in alignment.

Figure 8:
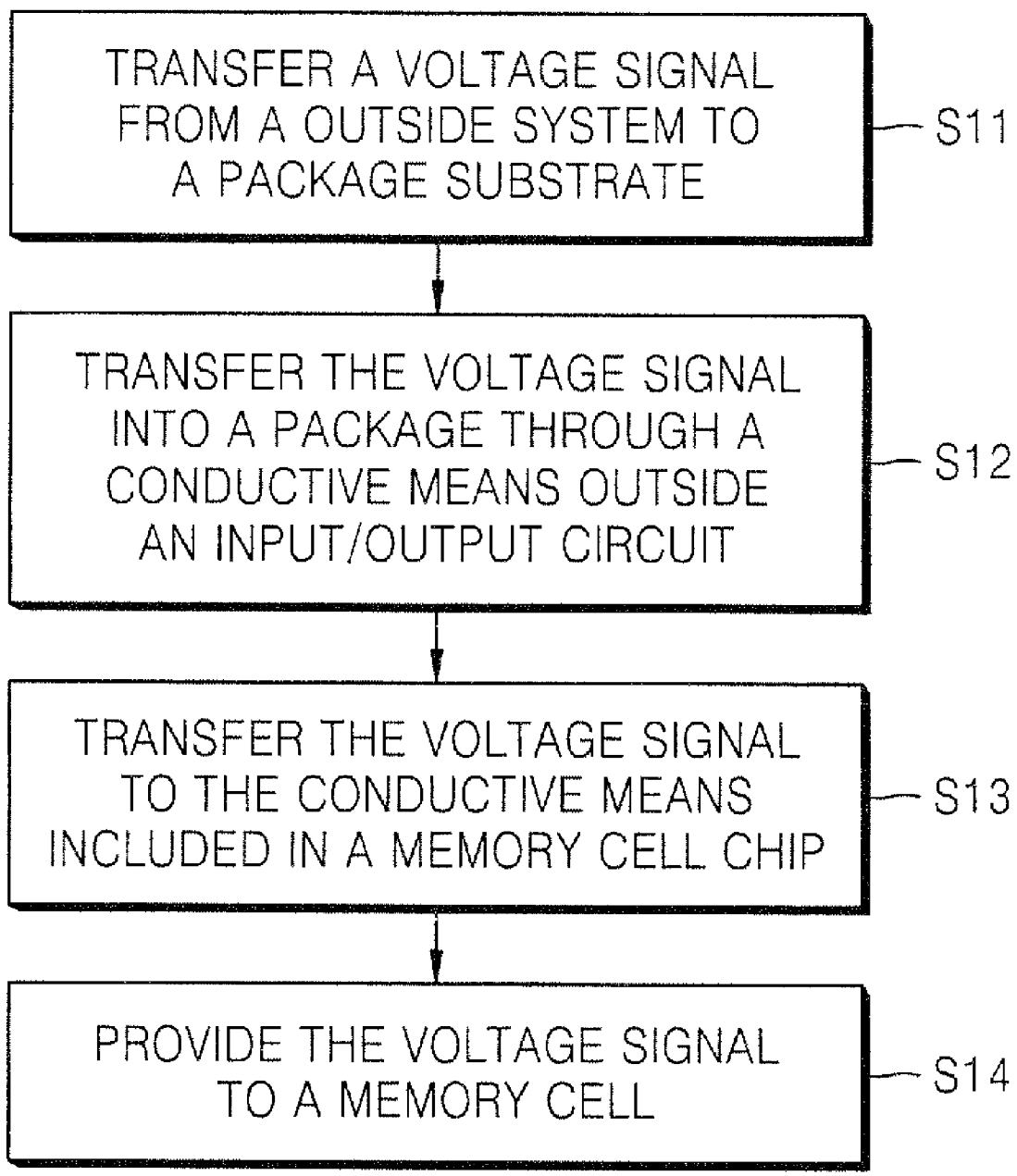
FIG. 8 is a flowchart illustrating a method of driving a semiconductor memory device according to an embodiment of the present invention.

FIG. 8 is a flowchart illustrating a method of driving a semiconductor memory device according to an embodiment of the present invention. Referring to FIG. 8, in the driving method, the power supply voltage and/or the ground voltage supplied from the outside system are transferred to the package substrate (step S11).

The voltage signal transferred to the package substrate is then transferred into the inside of the package through the first conductive means (e.g., vias) that are included in the overhead region of the first semiconductor chip including the input/output circuit. Alternatively, the first conductive means may be implemented as one or more solder balls formed outside the first semiconductor chip where the first chip does not have an overhead region (step S12). More particularly, the voltage signals for supplying power and/or ground voltages to the memory cells are transferred through first conductive means as described above.

The first conductive means is electrically connected to a second conductive means formed in the second semiconductor chip including the memory cell region. Accordingly, the voltage signal is transferred to the second conductive means through the first conductive means (step S13). The voltage signal that is transferred to the second conductive means is supplied to the memory cell through a pattern formed in the second semiconductor chip (step S14).

In the semiconductor memory device according to the present invention, an input/output circuit and a memory cell can be implemented in separate semiconductor chips and a voltage signal can be directly supplied to the memory cell so that a stable voltage signal by which noise is reduced can be supplied to the memory cell.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, the true technical protection scope of the present invention should be defined by the technical spirit of appended claims.

What is claimed is:

1. A semiconductor memory device comprising:
   a first semiconductor chip comprising an input/output circuit for sending/receiving signals to/from an outside system; and
   at least one second semiconductor chip comprising a memory cell region for storing data,
   wherein the second semiconductor chip receives at least one of a power signal and a ground signal through a conductive means formed outside the input/output circuit,
   wherein the first semiconductor chin comprises an active region and an overhead region, the active region including the input/output circuit, and the overhead region including the conductive means,
   wherein the conductive means electrically connects a package substrate directly to the second semiconductor chips.

2. The device of claim 1, wherein the first semiconductor chip and the second semiconductor chip have a stack structure.

3. The device of claim 1, wherein the at least one second semiconductor chip comprises one or more vias for transferring the voltage signal into the second semiconductor chip.

4. The device of claim 3, wherein the second semiconductor chip comprises one or more first vias for transferring a power supply voltage, and one or more second vias for transferring a ground voltage.

5. The device of claim 4, wherein the second semiconductor chip further comprises one or more third vias for receiving a data signal and a control signal, the data signal and control signal transferred through the input/output circuit.

6. The device of claim 5, wherein the conductive means comprises a fourth via electrically connected to the first via, and a fifth via electrically connected to the second via.

7. The device of claim 6, wherein the first semiconductor chip and the second semiconductor chip are stacked, the fourth via substantially vertically aligned with the first via, and the fifth via substantially vertically aligned with the second via.

8. The device of claim 7, wherein the power supply voltage is transferred to the second semiconductor chip through the fourth via, and the ground voltage is transferred to the one or more second semiconductor chips through the fifth via.

9. A method of driving a semiconductor memory device comprising:
- transferring a power supply voltage and/or a ground voltage supplied from an outside system to a package substrate;
- transferring the power supply voltage and/or the ground voltage into a package through a first conductive means disposed outside an input/output circuit included in a first semiconductor chip; and
- supplying the power supply voltage and/or the ground voltage through the first conductive means to one or more second semiconductor chips each of which comprises a memory cell region for storing data,
- wherein the one or more second semiconductor chips transfer the power supply voltage and/or the ground voltage into the second semiconductor chips using a second conductive means electrically connected to the first conductive means,
- wherein the first semiconductor chip comprises an active region and an overhead region, the active region includes the input/output circuit, and the overhead region includes the first conductive means,
- wherein the first conductive means includes one or more vias and electrically connects the package substrate directly to the one or more second semiconductor chips.

10. The method of claim 9, wherein the first conductive means includes one or more solder balls formed outside the first semiconductor chip to electrically connect the package substrate to the one or more second semiconductor chips.

11. The method of claim 10, wherein the second conductive means includes one or more first vias for transferring the power supply voltage and one or more second vias for transferring the ground voltage.

12. The method of claim 9, wherein the first conductive means includes one or more first vias for transferring the power supply voltage and one or more second vias for transferring the ground voltage.

13. A semiconductor memory device comprising:
- a package substrate having a first side and a second side, the package substrate including wiring formed in the package substrate;
- connection terminals disposed on the second side of the package substrate, the connection terminals electrically connected to the wiring in the package substrate;
- a first semiconductor chip disposed on the first side of the package substrate, the first semiconductor chip including an input/output circuit for sending/receiving a voltage signal, a data signal, and a control signal to/from an outside system, wherein the input/output circuit is in an active region at a substantially central portion of the first semiconductor chip;
- at least one second semiconductor chip stacked on the first semiconductor chip, the second semiconductor chip comprising a memory cell region in a peripheral portion of the second semiconductor chip for storing data; and
- a conductive means configured to electrically connect the second semiconductor chip directly to the wiring in the package substrate, the conductive means disposed outside the active region of the first semiconductor chip that includes the input/output circuit, wherein the at least one second semiconductor chip receives at least one of a power supply signal and a ground signal directly through the conductive means.

14. The device of claim 13 wherein the connection means includes solder balls formed between the first side of the package substrate and a bottommost second semiconductor chip.

15. The device of claim 13 wherein the connection means includes vias formed in an overhead region of the first semiconductor chip outside of the active region.

16. The device of claim 13 wherein a signal path from the connection terminals to the memory cell region of the second memory chip through the conductive means is substantially shorter than a signal path from the connection terminals to the memory cell region of the second memory chip through the input/output circuit of the first memory chip.

17. The device of claim 13, wherein the at least one second semiconductor chip includes two stacked semiconductor memory chips.

18. The device of claim 17, wherein a lower one of the two stacked semiconductor memory chips includes a via to electrically connect the conductive means to the memory cell region of an upper one of the two stacked semiconductor memory chips.

* * * * *